(12) United States Patent
Searles et al.

(10) Patent No.: US 11,675,380 B2
(45) Date of Patent: Jun. 13, 2023

(54) VOLTAGE REGULATION USING LOCAL FEEDBACK

(71) Applicant: Apple Inc., Cupertino, CA (US)

(72) Inventors: Shawn Searles, Austin, TX (US); Victor Zyuban, Sunnyvale, CA (US); Mohamed Abu-Rahma, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/658,408

(22) Filed: Apr. 7, 2022

(65) Prior Publication Data
US 2022/0300022 A1    Sep. 22, 2022

Related U.S. Application Data

(63) Continuation of application No. 17/006,707, filed on Aug. 28, 2020, now Pat. No. 11,320,849.

(51) Int. Cl.
*G05F 1/575* (2006.01)
*H03K 17/22* (2006.01)

(52) U.S. Cl.
CPC ........... *G05F 1/575* (2013.01); *H03K 17/223* (2013.01)

(58) Field of Classification Search
None
See application file for complete search history.

(56) References Cited

U.S. PATENT DOCUMENTS

| | | | |
|---|---|---|---|
| 5,796,982 A | 8/1998 | Iwami et al. | |
| 9,344,042 B2 | 5/2016 | Mao | |
| 9,705,393 B2 | 7/2017 | Golder et al. | |
| 9,960,682 B2 | 5/2018 | Yu | |
| 10,404,169 B2 | 9/2019 | Kim | |
| 10,581,426 B1 | 3/2020 | Lin et al. | |
| 10,627,839 B2 * | 4/2020 | Ho | G05F 1/56 |
| 11,094,395 B2 * | 8/2021 | Nazar | G11C 11/417 |
| 2020/0119643 A1 | 4/2020 | Petracca et al. | |

OTHER PUBLICATIONS

Ortiz, "Package Modeling Needs for a Robust IC Power Integrity Sign-Off," https://semiengineering.com/author/chris-ortiz/; Mar. 12, 2015, 10 pages.

* cited by examiner

*Primary Examiner* — Jeffery S Zweizig
(74) *Attorney, Agent, or Firm* — Kowert, Hood, Munyon, Rankin & Goetzel, P.C.; Dean M. Munyon

(57) ABSTRACT

A voltage regulator circuit may generate a regulated voltage level using a voltage level of a feedback node. The regulated voltage level may be distributed, via a power distribution network, to package power supply node of a package, into which an integrated circuit has been mounted. Power switches included in the integrated circuit may couple the package power supply node to respective local power supply nodes in the integrated circuit. A particular power switch may selectively couple different ones of the local power supply nodes to the feedback node, allowing the voltage regulator circuit to compensate for reductions in the regulated voltage level due to the power distribution network, as well as adjust the regulated voltage level based on power consumptions of load circuits coupled to the local power supply nodes.

20 Claims, 12 Drawing Sheets

VOLTAGE REGULATION USING LOCAL FEEDBACK

The present application is a continuation of U.S. application Ser. No. 17/006,707, entitled "Voltage Regulation Using Local Feedback," filed Aug. 28, 2020, the disclosure of which is incorporated by reference herein in its entirety.

BACKGROUND

Technical Field

Embodiments described herein relate to integrated circuits, and more particularly, to techniques for generating regulated power supply voltages.

Description of the Related Art

Modern computer systems may include multiple circuits blocks designed to perform various functions. For example, such circuit blocks may include processors, processor cores configured to execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power converter circuits configured to generate regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments for distributing power to an integrated circuit are disclosed. Broadly speaking, a voltage regulator circuit is configured to generate a particular voltage on a regulated power supply node using a voltage level of a feedback node. A power distribution network is coupled between the regulated power supply node and a package power supply node. A first power switch is configured to couple the package power supply node to a first local power supply node, and a second power switch is configured to selectively couple either the package power supply node or the first local power supply node to the feedback node. The voltage level of the regulated power supply node is reduced by parasitic circuit elements included in the power distribution network, which results in a different voltage level on the first local supply node. By coupling the first local power supply node to the feedback node, the voltage regulator circuit may be able to better maintain a desired voltage level on the first local power supply node by using a voltage sampled close to a load circuit coupled to the first local power supply node.

BRIEF DESCRIPTION OF THE DRAWINGS

The following detailed description makes reference to the accompanying drawings, which are now briefly described.

DETAILED DESCRIPTION OF EMBODIMENTS

Figure 1:
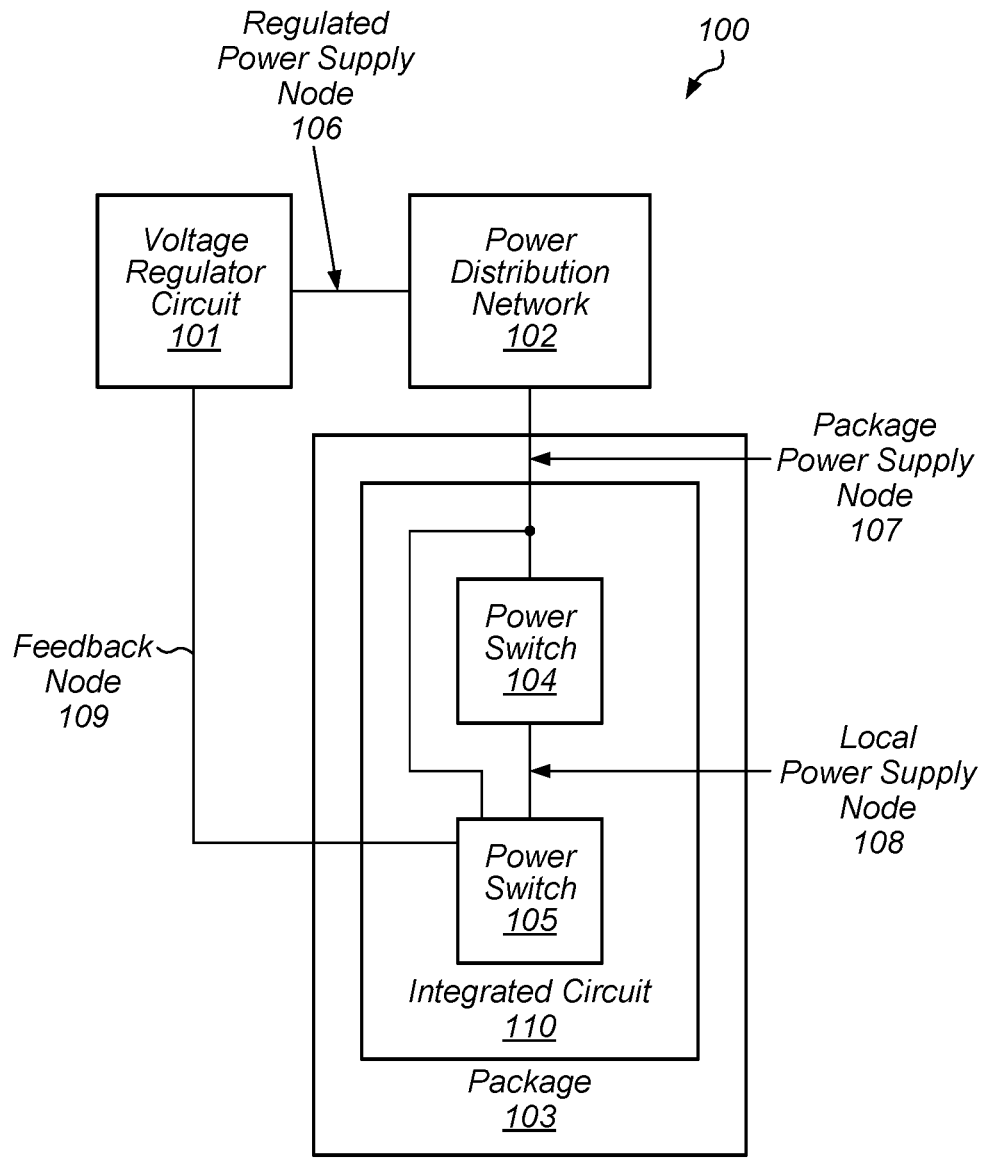
FIG. 1 is a block diagram of an embodiment of a computer system that employs a voltage regulator circuit.

Computer systems may include multiple circuit blocks configured to perform specific functions. Such circuit blocks may be fabricated on a common substrate and may employ different power supply voltage levels. Power management units (commonly referred to as "PMUs") may include multiple power converter circuits configured to generate regulated voltage levels for various power supply signals. Such power converter circuits may employ regulator circuit that include both passive circuit elements (e.g., inductors, capacitors, etc.) as well as active circuit elements (e.g., transistors, diodes, etc.).

Different types of voltage regulator circuits may be employed based on power requirements of load circuits, available circuit area, and the like. One type of commonly used voltage regulator circuit is a buck converter circuit. Such converter circuits include multiple phase circuits coupled to a regulated power supply node via corresponding inductors. Each of the phase circuits may be periodically activated to source current to a corresponding inductor and circulate current from a ground supply node through the inductor in order to maintain a desired voltage level on the power supply node. In order to determine when to activate, a voltage level of a feedback node may be compared to a reference voltage level.

In some computer systems, voltage regulator circuits may need different devices (e.g., thick-oxide transistors), large passive circuit elements (e.g., inductors), etc., to meet design goals. Such requirements can make fabrication of a voltage regulator circuit on a common integrated circuit with load circuits impractical. As a result, some voltage regulator circuits may be located on separate integrated circuits from load circuits coupled to its output.

In cases where a voltage regulator circuit is located on a different integrated circuit from the load circuits to which it is providing power, the integrated circuit including the voltage regulator circuit and the integrated circuit containing the load circuits are mounted on a substrate that includes multiple traces used to connect the regulated power supply node of the voltage regulator circuit to input power ports on the load circuits. In some cases, the integrated circuits may be mounted in packages before being mounted on the substrate.

As current supplied from the voltage regulator circuit moves to the load circuits, non-ideal characteristics of the traces and package pins (e.g., resistance, inductance, and the like), generate voltage drops, which result in the voltage level of the power supply at the load circuits being less at the output of the voltage regulator circuit. As a result, the performance (e.g., speed of operation) of the load circuits may not be at target levels.

The inventors realized that by generating a feedback signal for the voltage regulator circuit that is physically close to the load circuits, the effect of the voltage drops due to the non-ideal characteristics of the traces and packages can be mitigated. By providing the voltage regulator circuit with an indication of the voltage level a load circuit is actually receiving, the voltage regulator circuit may generate a higher voltage at its output to account for the voltage drops along the path to the load circuit.

In some cases, different load circuits may have different power consumptions at different times. Local versions of the power supply node may drop in voltage in different locations as the power consumptions of the load circuits varies. The inventors further realized that the effects on the local power supply nodes resulting from variation in the respective power consumptions of different load circuits could also be mitigated with the feedback signal technique. By periodically selecting different local power supply nodes as the feedback signal, the voltage regulator circuit can be provided with an indication of a worst-case power supply voltage level at any given time, allowing the voltage regulator circuit to source additional power as needed. The embodiments illustrated in the drawings and described below provide techniques for providing a feedback signal to a voltage regulator circuit that reflects a voltage level of a power supply node at a load circuit. By providing the voltage regulator circuit with the voltage level at the load circuit, the effects of voltage drops along the path from the voltage regulator circuit to the load circuit may be remediated. Moreover, the voltage regulator circuit may also be able to compensate for the effects associated with variations in power consumption of different load circuits.

A block diagram of an embodiment of a computer system that includes a voltage regulator circuit is depicted in FIG. 1 As illustrated computer system 100 includes voltage regulator circuit 101, power distribution network 102, and package 103 that includes power switches 104 and 105.

Voltage regulator circuit 101 is configured to generate a particular voltage level on regulated power supply node 106 using a voltage level of feedback node 109. In various embodiments, voltage regulator circuit 101 may be configured to compare the voltage level of feedback node 109 to a reference voltage level, and adjust the voltage level of regulated power supply node 106 using results of comparing the voltage level of feedback node 109 and the reference voltage level. Voltage regulator circuit 101 may be implemented according to various design styles. For example, in some embodiments, voltage regulator circuit 101 may be implemented as a low-dropout voltage regulator, a buck converter, or any other suitable type of voltage regulator or power converter circuit.

Package 103 includes package power supply node 107, which is coupled to regulated power supply node 106 via power distribution network 102. As used herein, a power distribution network includes a collection of circuit board traces, package leads or bumps, package traces, and the like, that connect one power supply node to another power supply node. The resistances, capacitances, and inductances associated with the various traces, leads, bumps, etc., that are included in power distribution network 102 may drop the voltage level of package power supply node 107 such that the voltage level of package power supply node 107 is less than the voltage level of regulated power supply node 106.

Integrated circuit 110 is mounted inside package 103. Although only a single integrated circuit is depicted as being mounted in package 103, in other embodiments, additional integrated circuits may be also mounted in package 103. In various embodiments, package 103 may be implemented as a ceramic pin grid or ball grid array.

Integrated circuit includes power switches 104 and 105. Power switch 104 is configured to couple package power supply node 107 to local power supply node 108. In various embodiments, power switch 104 may be used to de-couple local power supply node 108 from package power supply node as part of a power gating operation. The process of disconnecting a circuit and its associated local power supply node from a higher-level power supply node is commonly referred to as "power gating" and is used to reduce leakage current of the circuit when the circuit is not being used.

Power switch 105 is configured to selectively couple either package power supply node 107 or local power supply node 108 to feedback node 109. For example, during a power gating operation, local power supply node 108 will be floating, so power switch 105 will couple package power supply node 107 to feedback node 109. Once the power gating operation has completed, power switch 105 will couple local power supply node 108 to feedback node 109. By using the voltage levels of power supply nodes that are located as close to load circuits as possible as feedback signals, voltage regulator circuit 101 may be able to compensate for the losses in power supply voltage associated with the distribution of the power supply voltage. For example, voltage regulator circuit 101 may increase the voltage level of regulated power supply node 106 to that the voltage level of local power supply node 108 is within specified limits for load circuits coupled to local power supply node 108.

Figure 2:
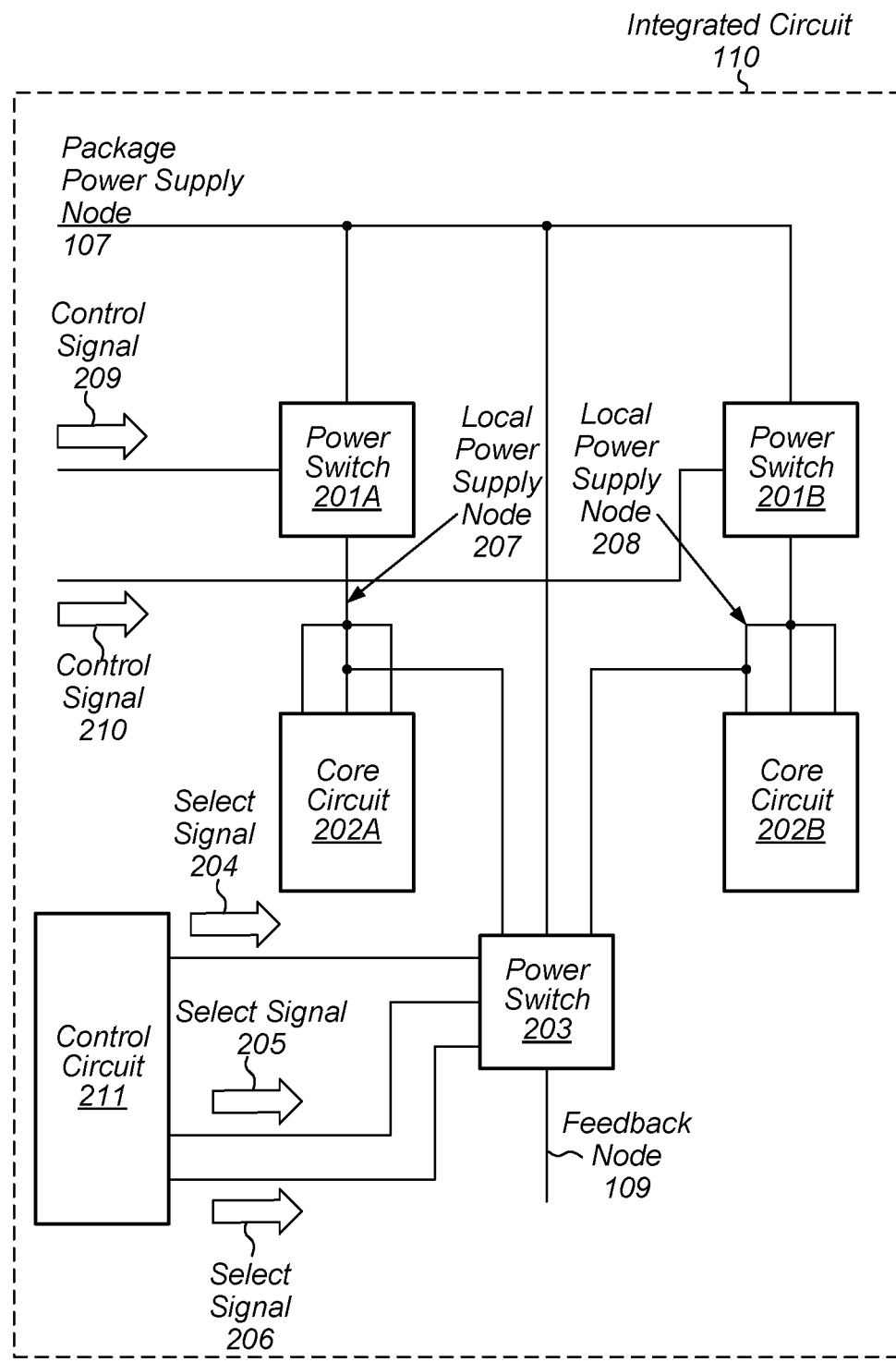
FIG. 2 is a block diagram of an embodiment of a package included in a computer system.

A block diagram depicting an embodiment of integrated circuit 110 is depicted in FIG. 2. As illustrated, integrated circuit 110 includes power switches 201A-201B, core circuits 202A-202B, power switch 203, and control circuit 211.

Core circuit 202A is coupled to local power supply node 207, and core circuit 202B is coupled to local power supply node 208. In various embodiments, local power supply nodes 207 and 208 may correspond to local power supply node 108 as depicted in FIG. 1. It is noted that cores circuits 202A and 202B may include multiple power ports, each connected to their respective local power supply node. Multiple power ports are often employed to provide a lower resistance path into a circuit in order to minimize a voltage drop on a power supply node during high current demand situations. In various embodiments, core circuits 202A and 202B may be general-purpose processor circuits configured to execute software or program instructions. Although only two core circuits and two local power supply nodes are depicted in FIG. 2, in other embodiments, additional core circuits, coupled to respective local power supply nodes, may be included.

Power switch 201A is configured couple package power supply node 107 to local power supply node 207 based on control signal 209. For example, in response to an assertion of control signal 209, power switch 201A couples package power supply node 107 to local power supply node 207. In various embodiments, control signal 209 may be used to disconnect core circuit 202A from package power supply node 107 during power gating operations.

Power switch 201B is configured to couple package power supply node 107 to local power supply node 208 based on control signal 210. For example, in response to an assertion of control signal 210, power switch 201B couples package power supply node 107 to local power supply node 208. In various embodiments, control signal 210 may be used to disconnect core circuit 202B from package power supply node 107, during power gating operations.

Power switch 203 is configured to selectively couple either package power supply node 107, local power supply node 207, or local power supply node 208 to feedback node 109 based on select signals 204-206. For example, if select signal 204 is asserted, then power switch 203 will couple local power supply node to feedback node 109. Alternatively, if select signal 206 is asserted, power switch 203 will couple package power supply node 107. By coupling different ones of package power supply node 107, local power supply node 207, or local power supply node 208, variations of the voltage level of the power supply for supplied to core circuits 202A and 202B may be fed back to voltage regulator circuit 101 so that it may compensate for losses associated with power distribution network 102 and/or variations in performance of core circuits 202A and 202B.

As described above, core circuits 202A and 202B may have multiple power ports that are coupled to local power supply nodes 207 and 208, respectively. Power switch 203 may be coupled to different ones of the multiple power points of core circuits 202A and 202B. In some cases, power ports near high-power sub-circuits included in core circuits 202A and 202B may be coupled to power switch 203. Power ports located near high-power circuits are often referred to a "hot spots," and by coupling such hot spots to feedback node 109, voltage regulator circuit 101 may compensate for the highest power consumptions circuits, thereby ensuring adequate power for those circuits.

Control circuit 211 is configured to generate select signals 204-206. In some cases, control circuit 211 may be configured to use respective power consumptions, or other operating characteristics, of cores circuits 202A-202B to generate select signals 204-206. As described below, control circuit 211 may be configured to generate select signals, such that select signals 204-206 are non-overlapping (i.e., only one of select signals 204-206 may be asserted at any given time). In various embodiments, control circuit may be implemented as a microcontroller, a general-purpose processor configured to execute software or program instructions, a state machine or other sequential logic circuit.

Figure 3:
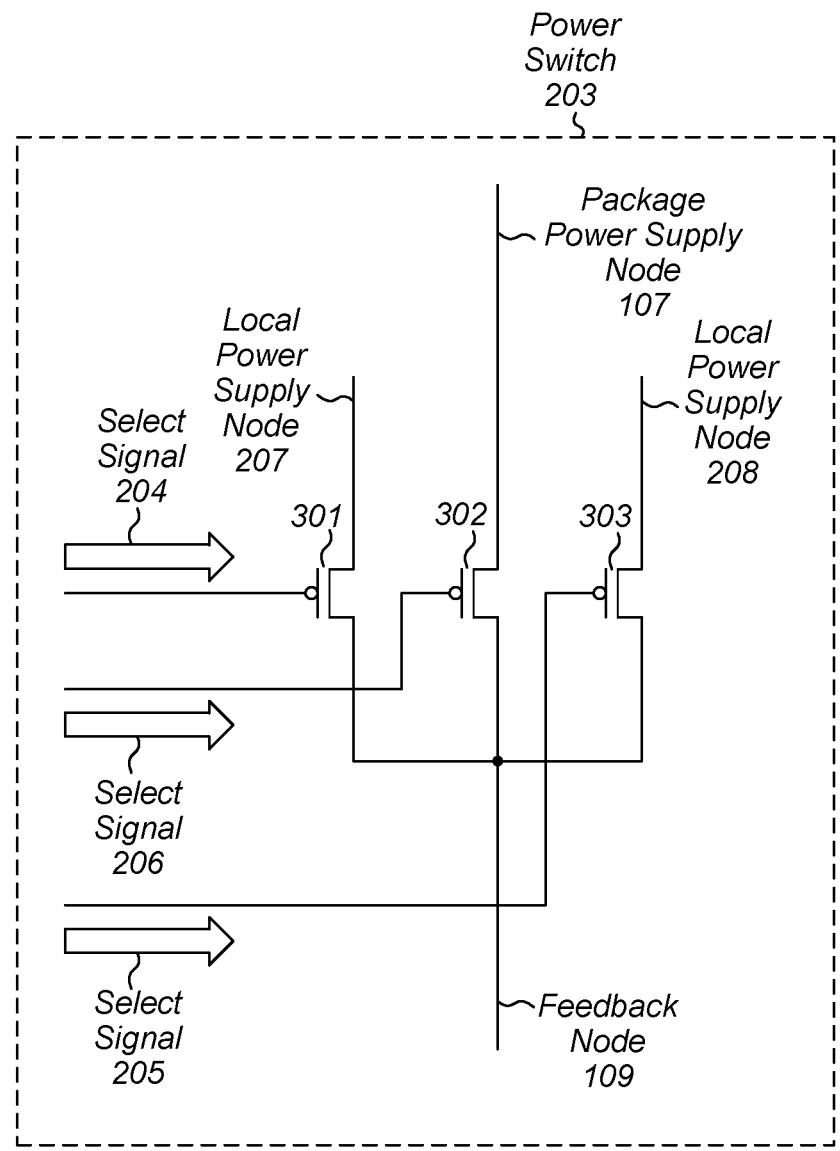
FIG. 3 is a block diagram of an embodiment of a power switch.

Turning to FIG. 3, a block diagram of an embodiment of power switch 203 is depicted. As illustrated, power switch 203 includes devices 301-303. Device 301 is coupled between local power supply node 207 and feedback node 109, while device 303 is coupled between local power supply node 208 and feedback node 109. Device 302 is coupled between package power supply node 107 and feedback node 109. This arrangement of devices 301-303 with all of the device coupled to a common node (e.g., feedback node 109) is commonly referred to as a "wired-OR" arrangement.

Device 301 is configured to couple local power supply node 207 to feedback node 109 based on select signal 204, while device 303 is configured to couple local power supply node 208 to feedback node 109 based on select signal 205. Device 302 is configured to couple package power supply node 107 to feedback node 109 based on select signal 206. For example, when select signals 204 and 206 are at a high logic level, and select signal 205 is at a low logic level, local power supply node 208 is coupled to feedback node 109.

By setting one of select signals 204-206 to a low logic level, a corresponding one of local power supply node 207, local power supply node 208, or package power supply node 107, can be coupled to feedback node 109. As described below, selecting particular nodes to couple to feedback node 109, allows hot spot node to be used by a voltage regulator circuit (e.g., voltage regulator circuit 101) to regulate the voltage level of package power supply node 107, thereby allowing the voltage regulator circuit to compensate for circuits with higher current demands.

Although each of devices 301-303 are depicted as being single devices, in other embodiment, any of devices 303-303 may include multiple devices coupled in parallel. It is noted that devices 301-303 may be implemented as p-channel metal-oxide semiconductor field-effect transistors (MOSFETs), Fin field-effect transistors (FinFETs), or other suitable transconductance devices, available in complementary metal-oxide semiconductor (CMOS) or other semiconductor technologies Turning to FIG. 4, a block diagram of another embodiment of power switch is depicted. As illustrated, power switch 400 includes device 401 that is coupled between package power supply node 107 and local power supply node 402. It is noted that in various embodiments, power switch 400 may correspond to either of power switches 201A or 201B.

Device 401 is configured to couple, based on select signal 403, package power supply node 107 to local power supply node 402. For example, in response to select signal 403 being set to a low logic value, device 401 activates, thereby coupling package power supply node 107 to local power supply node 402.

Figure 4:
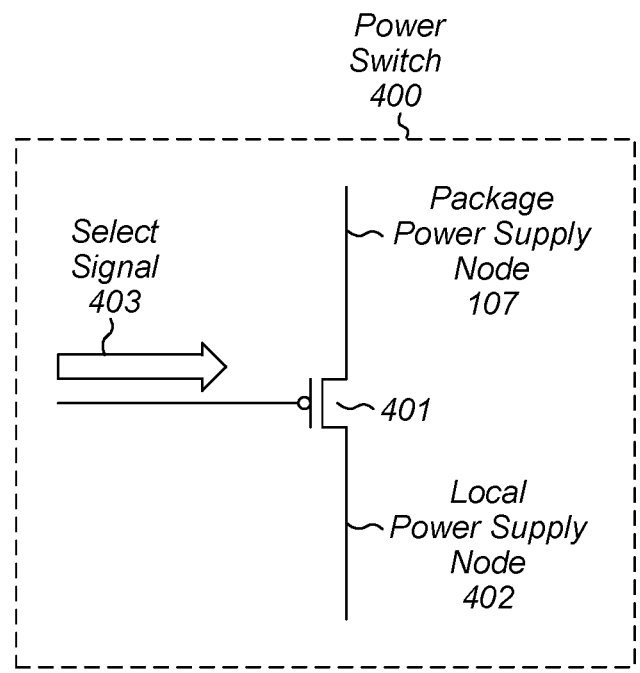
FIG. 4 is a block diagram of another embodiment of a power switch.

Although only a single device is depicted in the embodiment of FIG. 4, in other embodiments, device 401 may include any suitable number of devices coupled together in parallel. Moreover, it is noted that device 401 may be implemented as a p-channel MOSFET, FinFET, or other suitable transconductance device available in CMOS or other semiconductor technologies.

Figure 5:
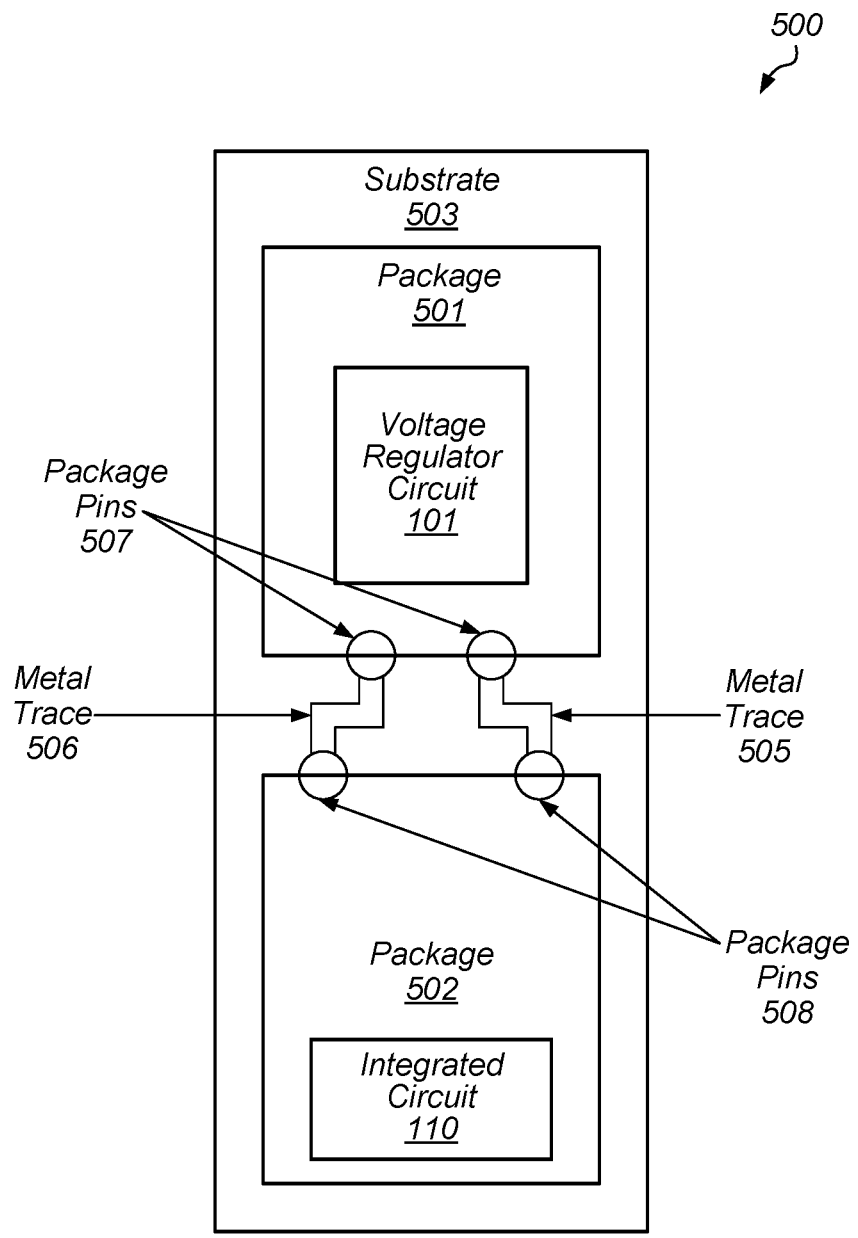
FIG. 5 is a block diagram a sub-assembly of a computer system.

Turning to FIG. 5, a block diagram of a sub-assembly of a computer system is depicted. As illustrated, sub-assembly 500 includes substrate 503, onto which are mounted packages 501 and 502. Voltage regulator circuit 101 is mounted in package 501 and integrated circuit 110 is mounted in package 502.

Substrate 503 includes metal trace 505 and metal trace 506. It is noted that although only two metal traces are depicted, in other embodiments, substrate 503 may include any suitable number of traces. In various embodiments, substrate 503 may be a circuit board, interposer, or other suitable structure to which semiconductor packages may be mounted. In some cases, substrate 503 may include multiple layers, each containing metal traces that may be connected to metal traces on other layers using metal vias.

Package 501 includes package pins 507, and package 502 includes package pins 508. In some cases, these pins may be implemented as solder bumps, balls, or microballs. Packages 501 and 502 may be implemented as ceramic ball grid array packages, or other suitable semiconductor package types that can be mounted on substrate 503. It is noted that although package pins 507 and 508 are depicted as being along an edge of packages 501 and 502, respectively, in other embodiments, package pins 507 and 508 may be located on an underside of their respective packages.

Metal traces 505 and 506, as well as package pins 507 and 508, have resistance values associated with them. In addition to the resistance values, metal traces 505 and 506, and package pins 507 and 508 may also have inductance values (both self-inductance values as well as inductance to nearby conductors) and capacitance values (both capacitance to ground as well as capacitance to nearby conductors). The various resistance, inductance, and capacitance values of metal traces 505 and 506, and package pins 507 and 508, as well as other wiring, pins, connections between voltage regulator circuit 101 and integrated circuit 110 (not shown) are considered to be part of power distribution network 102. The aforementioned resistance, inductance, and capacitance values and may drop voltage as current from voltage regulator circuit 101 makes its way to local power supply node 108, resulting in the voltage level of local power supply node 108 being less than the voltage level of regulated power supply node 106. As noted above, by coupling local power supply node 108 to feedback node 109, voltage regulator circuit 101 may be able to compensate for the drop of the power distribution network 102 by increasing the voltage level of regulated power supply node 106.

As described above, power switch 203 is configured to couple either local power supply node 207, local power supply node 208, or package power supply node 107 to the feedback node 109, for use by voltage regulator circuit 101. By coupling differing ones of the aforementioned nodes to feedback node 109, differences in power consumption between different circuit blocks in integrated circuit 110 can be relayed to voltage regulated circuit 101 to better maintain voltage regulation. For example, if core circuit 202B is consuming more power than core circuit 202A, then local power supply node 208 may be coupled to feedback node 109 so that voltage regulator circuit 101 can compensate for the higher power consumption.

Select signals 204-206 may be used in different fashions based on different operating conditions within integrated circuit 110. FIGS. 6-10 depict examples of how select signals 204-206 may be used in such different circumstances. It is noted that in FIGS. 6-10, select signals 204-206 are depicted as being active low, i.e., the signals are asserted when they are at logical-0 values, and de-asserted when they are at logical-1 values. In cases where power switch 203 includes devices other than p-channel MOSFETs, select signals 204-206 may have different values when asserted.

Figure 6:
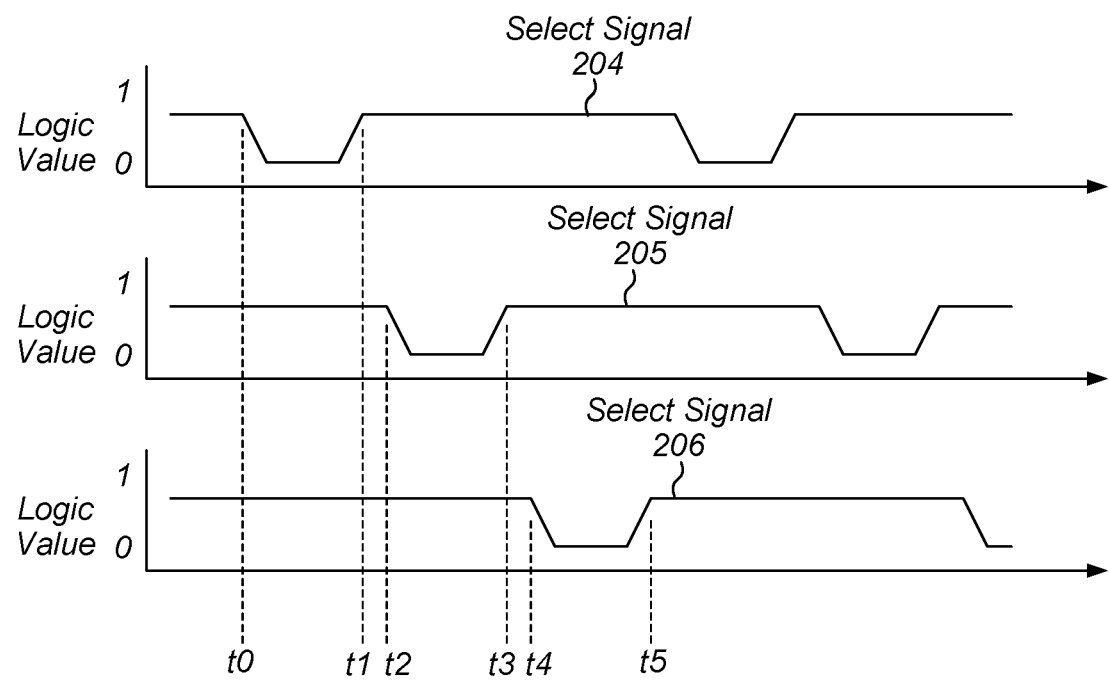
FIG. 6 is a diagram illustrating waveforms for control signals associated with power switches in a computer system.

Turning to FIG. 6, example waveforms for select signals 204-206 with both core circuit 202A and core circuit 202B operating are depicted. At time t0, select signal 204 transitions from a logical-1 value to a logical-0 value, thereby coupling local power supply node 207 to feedback node 109. Local power supply node 207 remains coupled to feedback node 109 until select signal 204 returns to a logical-1 value at time t1.

At time t2, select signal 205 transitions from a logical-1 value to a logical-0 value, thereby coupling local power supply node 208 to feedback node 109. Local power supply node 208 remains coupled to feedback node 109 until select signal 205 returns to a logical-1 value at time t3.

At time t4, select signal 206 transitions from a logical-1 value to a logical-0 value, thereby coupling package power supply node 107 to feedback node 109. Package power supply node 107 remains coupled to feedback node 109 until select signal 206 returns to a logical-1 value at time t5. It is noted that select signals 204-206 are non-overlapping to prevent local power supply nodes 207 and 208, and package power supply node 107 from being coupled to feedback node 109 at the same time. It is further noted that although a single cycle of select signals 204-206 is depicted in FIG. 6, in other embodiments, the depicted cycle may be repeated any suitable number of times.

Figure 7:
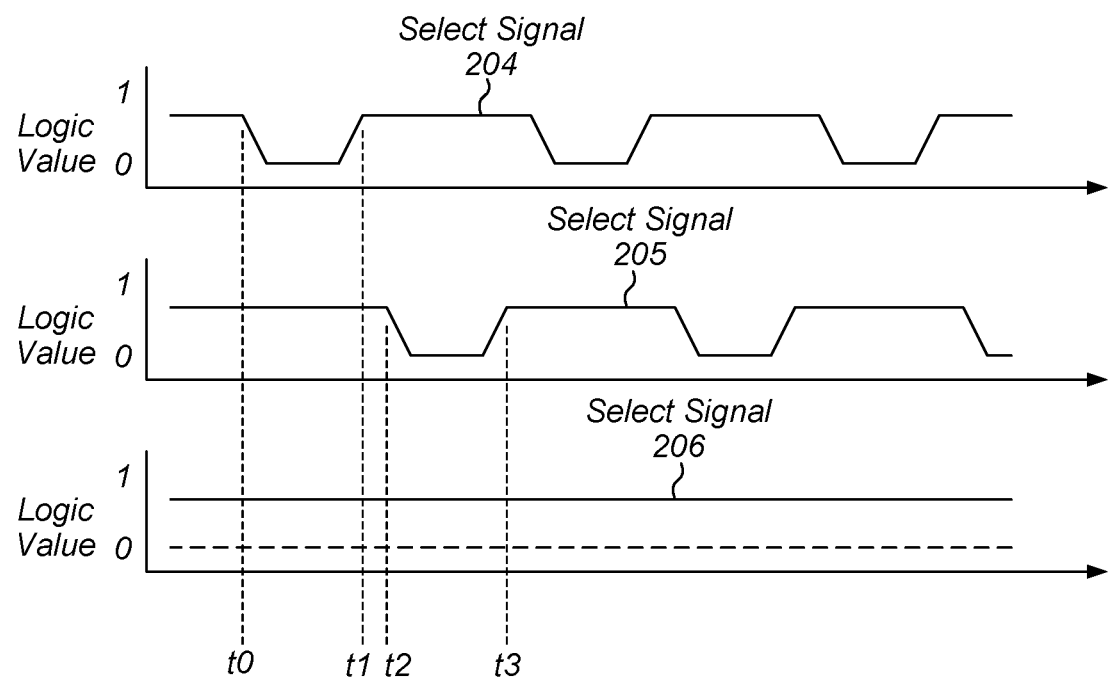
FIG. 7 is a diagram illustrating waveforms for control signals associated with power switches in a computer system when power gating is not being performed.

In some cases, only the respective voltage level of local power supply nodes 207 and 208 are used to generate a feedback voltage for voltage regulator circuit 101. Example waveforms, for this case, are depicted in FIG. 7.

At time t0, select signal 204 transitions from a logical-1 value to a logical-0 value, thereby coupling local power supply node 207 to feedback node 109. Local power supply node 207 remains coupled to feedback node 109 until select signal 204 returns to a logical-1 value at time t1.

At time t2, select signal 205 transitions from a logical-1 value to a logical-0 value, thereby coupling local power supply node 208 to feedback node 109. Local power supply node 208 remains coupled to feedback node 109 until select signal 205 returns to a logical-1 value at time t3. It is noted that select signals 204 and 205 are non-overlapping to prevent both local power supply nodes 207 and 208 from being coupled to feedback node 109 at the same time.

The alternating coupling of local power supply nodes 207 and 208 to feedback node 109 may continue while core circuits 202A and 202B remain in an operating mode without power gating. During this period of time, select signal 206 is at a logical-1 value so that package power supply node 107 is not coupled to feedback node 109. By alternating between using local power supply node 207 and local power supply node 208 as a feedback voltage, voltage regulator circuit 101 can adjust to differences in power consumption between core circuits 202A-B.

Figure 8:
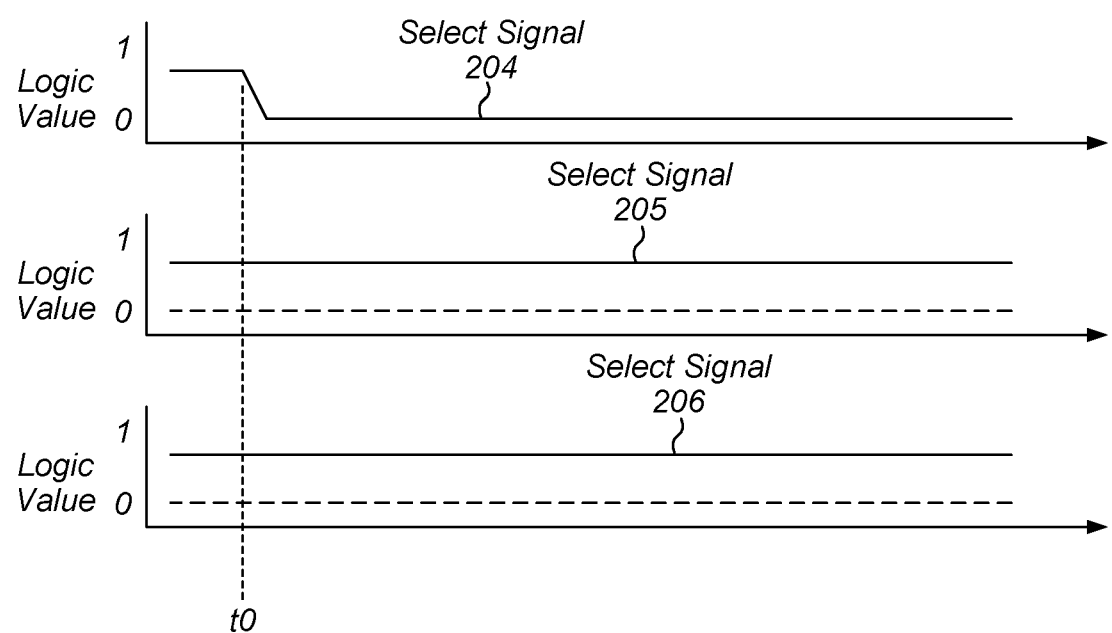
FIG. 8 is a diagram illustrating waveforms for control signals associated with power switches in a computer system when only a single core is active.

Turning to FIG. 8, example waveforms for select signals 204-206 while only core circuit 202A is operating are depicted. At time t0, select signal 204 transitions from a logical-1 value to a logical-0 value, coupling local power supply node to feedback node 109. Select signals 205 and 206 remain at logical-1 values. Since only core circuit 202A is operating, the voltage level of local power supply node 207 is used as the sole feedback voltage for voltage regulator circuit 101.

Figure 9:
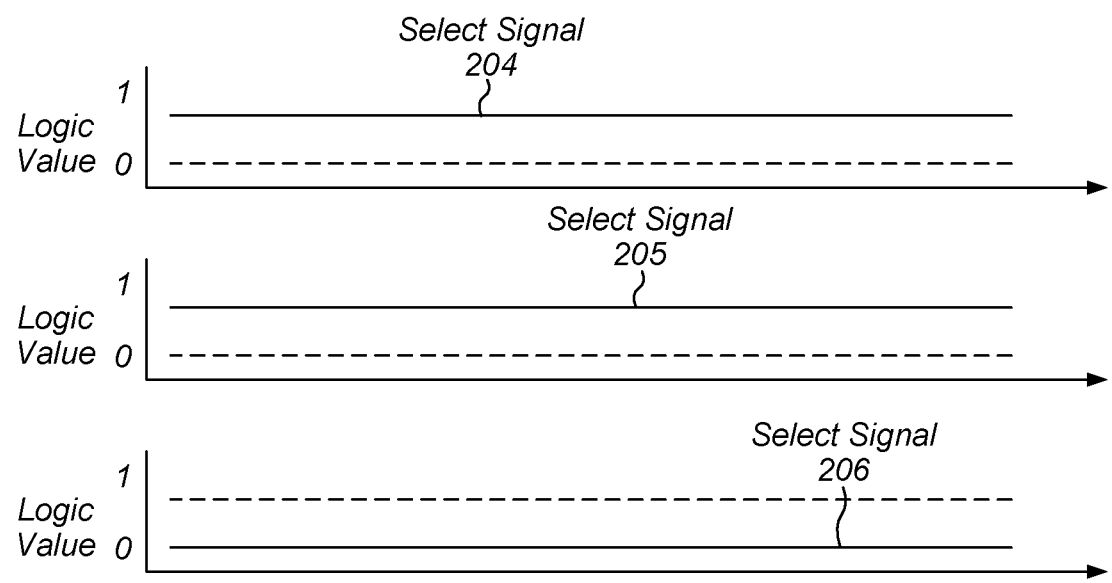
FIG. 9 is a diagram illustrating waveforms for control signals associated with power switches in a computer system during a power gating operation.

Example waveforms for the case when both core circuits 202A-B are power gated are depicted in FIG. 9. As illustrated, select signals 204 and 205 are at logical-1 values, isolating local power supply nodes 207 and 208 (which may be floating due to power gating) from feedback node 109. To provide a feedback voltage to voltage regulator circuit 101, select signal 206 is set to a logical-0 value, which couples package power supply node 107 to feedback node 109. It is noted that although the waveforms depicted in FIG. 9 are described in terms of a power gating operation, similar values for select signals 204-206 may be used in other situations that do not need the respective voltage levels of local power supply nodes 207 and 208 as feedback voltages for voltage regulator circuit 101.

Figure 10:
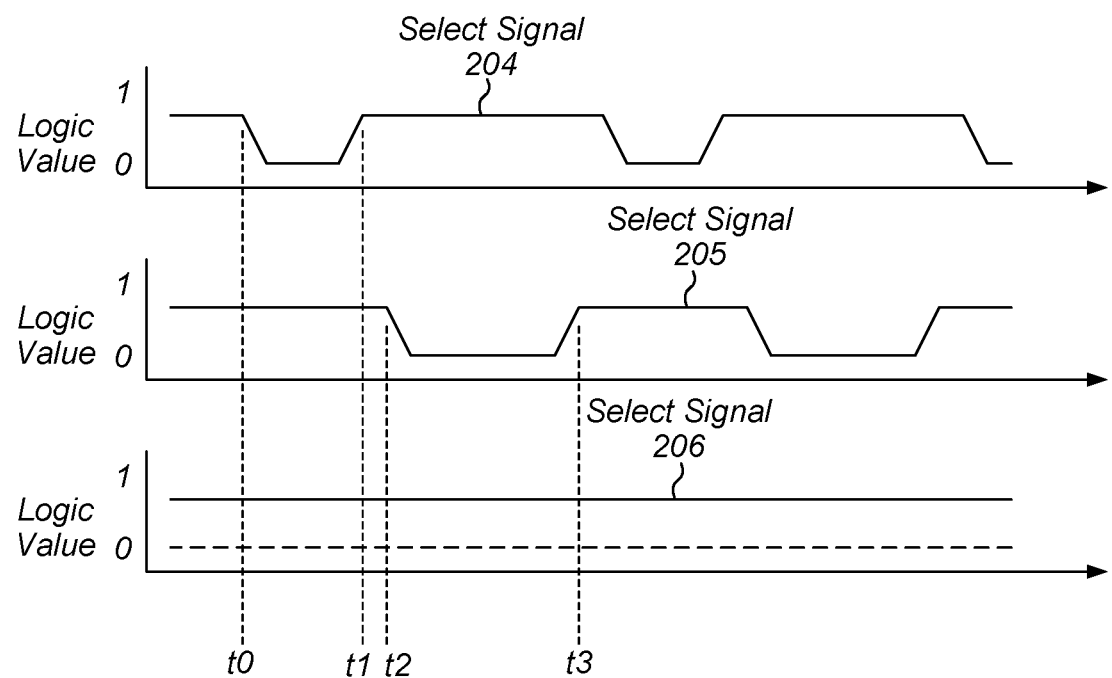
FIG. 10 is a diagram illustrating waveforms for control signals associated with power switches in a computer system when cores are operating with different duty cycles.

In some cases, core circuits 202A and 202B may be operating at different frequencies or with different compute loads, resulting in different power consumptions. To make sure that voltage regulator circuit 101 is sourcing sufficient energy, the duration (or duty cycle) that local power supply nodes 207 and 208 are coupled to feedback node 109 may be adjusted. Example waveforms for such a case are depicted in FIG. 10.

At time t0, select signal 204 transitions from a logical-1 value to a logical-0 value, thereby coupling local power supply node 207 to feedback node 109. Local power supply node 207 remains coupled to feedback node 109 until select signal 204 returns to a logical-1 value at time t1.

At time t2, select signal 205 transitions from a logical-1 value to a logical-0 value, thereby coupling local power supply node 208 to feedback node 109. Local power supply node 208 remains coupled to feedback node 109 until select signal 205 returns to a logical-1 value at time t3. In this case, the duration from time t2 to t3 is longer than the duration from time t0 to t1. With the longer duration from time t2 to t3, the power demand from core circuit 202B is weighted more heavily on feedback node 109, allowing voltage regulator circuit 101 to provide sufficient energy for both core circuits 202A and 202B. Since there is no power gating, select signal 206 is set to a logical-1 value to prevent package power supply node 107 from being coupled to feedback node 109.

Figure 11:
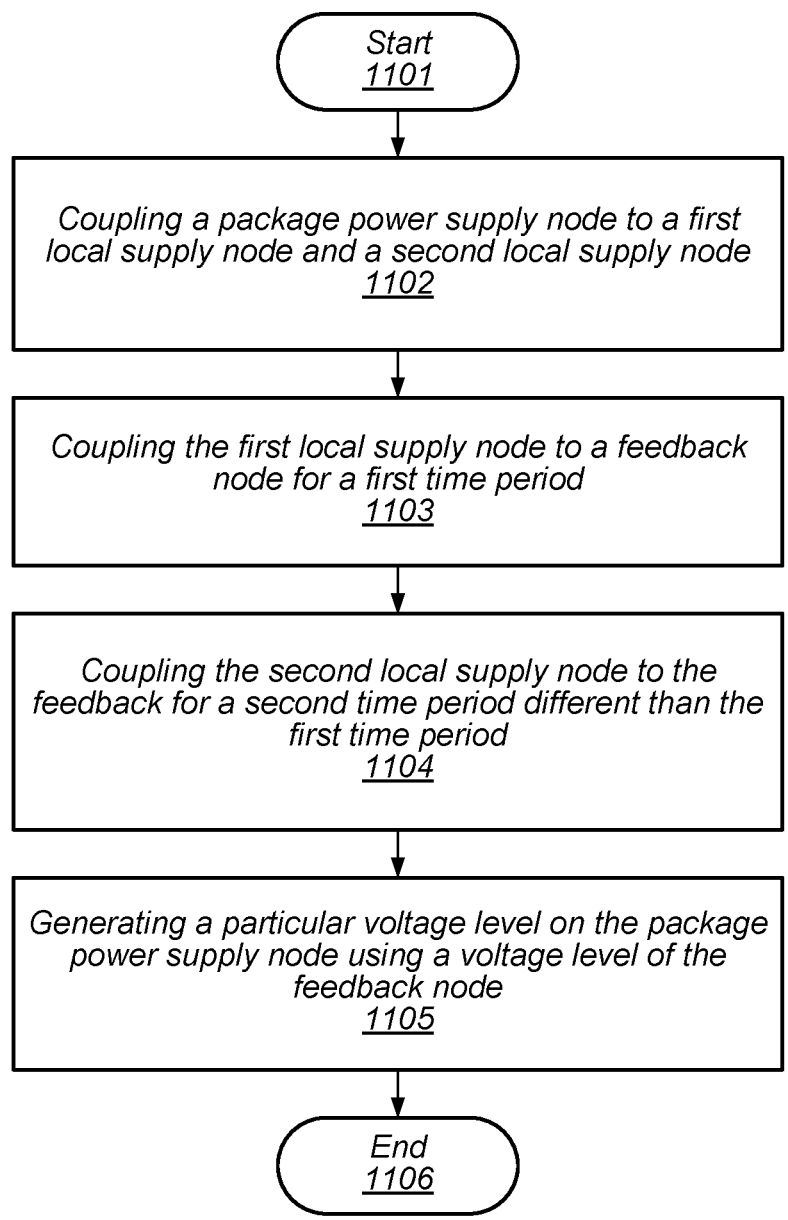
FIG. 11 depicts a flow diagram illustrating an embodiment of a method for operating a voltage regulator circuit and power switches in a computer system.

Turning to FIG. 11, a flow diagram depicting an embodiment of a method for operating a voltage regulator circuit is illustrated. The method, which begins in block 1101, may be applied to various voltage regulator circuits, such as voltage regulator circuit 101 as illustrated in FIG. 1.

The method includes coupling a package power supply node to a first local supply node and a second local supply node (block 1102). In various embodiments, a first processor core is coupled to the first local supply node and a second processor core is coupled to the second local supply node. The method may also include monitoring respective power consumptions of the first processor core and the second processor core.

The method also includes coupling the first local supply node to a feedback node for a first time period (block 1103). In some embodiments, coupling the first local supply node to the feedback node includes closing, for the first time period, a power switch coupled between the first local supply node and the feedback node. In some cases, the method may also include, in response to a power gating operation for the first processor core, de-coupling the first load supply node from the feedback node and coupling the package power supply node to the feedback node.

The method further includes coupling the second local supply node different than the first time period (block 1104). The method may also include coupling the package power supply node to the feedback node for a third time period different than the first and second time periods. In some cases, the method may include selecting, based on the respective power consumptions of the first processor core and the second processor core, a particular one of the first local supply node and the second local supply node to couple to the feedback node.

The method also includes generating a particular voltage level on the package power supply node using a voltage level of the feedback node (block 1105). In various embodiments, generating the particular voltage level including comparing the voltage level of the feedback node to a reference voltage level. The method concludes in block 1106.

Figure 12:
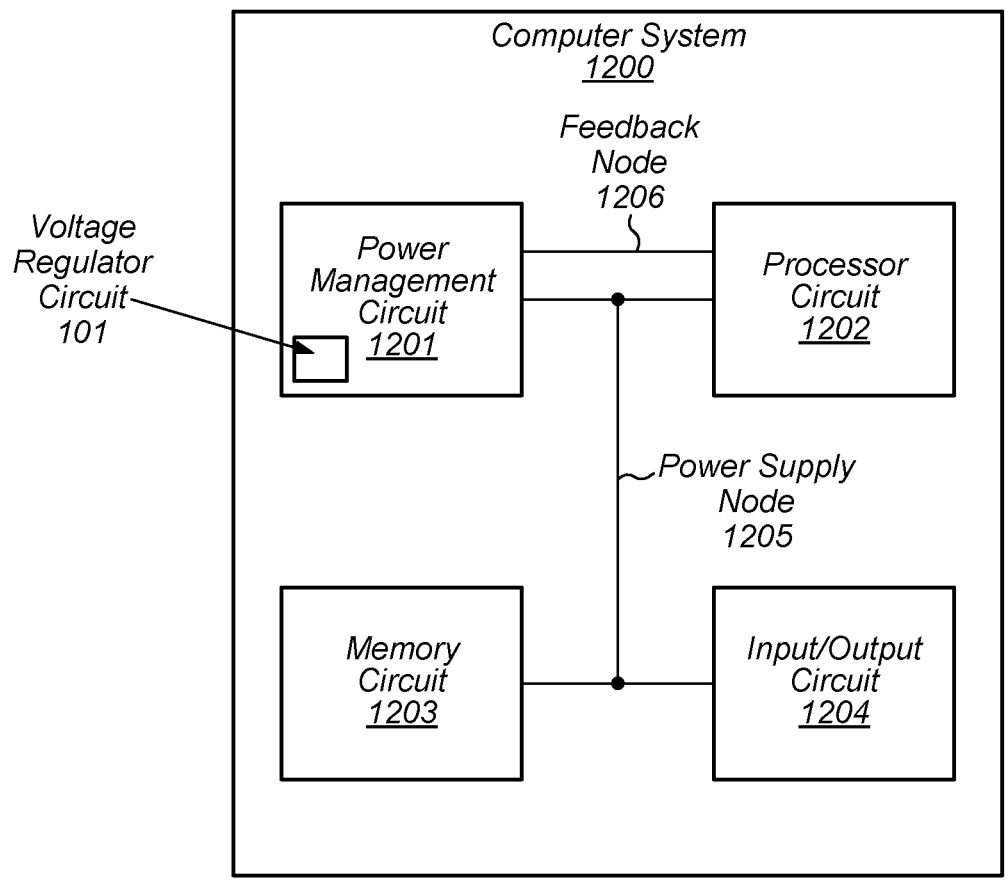
FIG. 12 illustrates a block diagram of a computer system.

A block diagram of computer system is illustrated in FIG. 12. In the illustrated embodiment, the computer system 1200 includes power management circuit 1201, processor circuit 1202, memory circuit 1203, and input/output circuits 1204, each of which is coupled to regulated power supply node 106. It is noted that processor circuit 1202, memory circuit 1203, and input/output circuits 1204 may be referred to as "load circuits" that are coupled to a regulated power supply node 106. In various embodiments, computer system 1200 may be a system-on-a-chip (SoC) and/or be configured for use in a desktop computer, server, or in a mobile computing application such as, e.g., a tablet, laptop computer, or wearable computing device.

Power management circuit 1201 includes voltage regulator circuit 101 which is configured to generate, using a voltage level of feedback node 109, a regulated voltage level on power supply node 1205 in order to provide power to processor circuit 1202, memory circuit 1203, and input/output circuits 1204. Although power management circuit 1201 is depicted as including a single power converter circuit, in other embodiments, any suitable number of power converter circuits may be included in power management circuit 1201, each configured to generate a regulated voltage level on a respective one of multiple internal power supply signals included in computer system 1200.

Processor circuit 1202 is configured to couple one or more internal power supply nodes (not shown) to feedback node 1206. In various embodiments, processor circuit 1202 may include multiple cores (not shown) coupled to respective ones of the one or more internal power supply nodes. As described above, processor circuit 1202 may couple different one of the one or more internal power supply nodes to the feedback node 109 at different times based on an activity level of the multiple cores. Processor circuit 1202 may, in various embodiments, be representative of a general-purpose processor that performs computational operations. For example, processor circuit 1202 may be a central processing unit (CPU) such as a microprocessor, a microcontroller, an application-specific integrated circuit (ASIC), or a field-programmable gate array (FPGA).

Memory circuit 1203 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although in a single memory circuit is illustrated in FIG. 12, in other embodiments, any suitable number of memory circuits may be employed.

Input/output circuits 1204 may be configured to coordinate data transfer between computer system 1200 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 1204 may be configured to implement a version of Universal Serial Bus (USB) protocol or IEEE 1394 (Firewire®) protocol.

Input/output circuits 1204 may also be configured to coordinate data transfer between computer system 1200 and one or more devices (e.g., other computing systems or integrated circuits) coupled to computer system 1200 via a network. In one embodiment, input/output circuits 1204 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 1204 may be configured to implement multiple discrete network interface ports.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
a voltage regulator circuit configured to generate a particular voltage level on a regulated power supply node using a feedback signal; and
a package that includes an integrated circuit and a package power supply node coupled to the regulated power supply node via a power distribution network, wherein the integrated circuit includes a plurality of circuit blocks coupled to a corresponding plurality of local power supply nodes, and wherein the integrated circuit is configured to:
generate a plurality of selection signals whose respective durations are based on corresponding power consumptions of the plurality of circuit blocks;
select a particular local power supply node of the corresponding plurality of local power supply nodes using a particular one of the plurality of selection signals; and
generate the feedback signal using a voltage level of the particular local power supply node.

2. The apparatus of claim 1, wherein to generate the feedback signal using the voltage level of the particular local power supply node, the integrated circuit is further configured to couple the particular local power supply node to a feedback node through which the feedback signal propagates.

3. The apparatus of claim 2, wherein the integrated circuit includes a plurality of power switch circuits, and wherein to generate the feedback signal the integrated circuit is further configured to activate a particular device within a particular power switch circuit of the plurality of power switch circuits, wherein the particular device is coupled between the particular local power supply node and the feedback node.

4. The apparatus of claim 1, wherein the integrated circuit is further configured to:
select a first local power supply node of the corresponding plurality of local power supply nodes for a first time period;
select a second local power supply node of the corresponding plurality of local power supply nodes for a second time period; and
generate the feedback signal using a first voltage level of the first local power supply node during the first time period; and
generate the feedback signal using a second voltage level of the second local power supply node during the second time period.

5. The apparatus of claim 1, wherein the integrated circuit is further configured to de-couple a different circuit block from the package power supply node in response to an activation of a power gating mode.

6. The apparatus of claim 1, wherein the integrated circuit includes a power switch circuit coupled between the package power supply node and the particular local power supply node.

7. The apparatus of claim 1, wherein the plurality of circuit blocks includes at least one processor circuit.

8. A method, comprising:
generating, by a voltage regulator circuit, a voltage level on regulated power supply node;
coupling the regulated power supply node to a package power supply node via a power distribution network included in a package that includes an integrated circuit that includes a plurality of circuit blocks coupled to a corresponding plurality of local power supply nodes;
generating a plurality of selection signals whose respective durations are based on corresponding power consumptions of the plurality of circuit blocks;
selecting a particular local power supply node using a particular one of the plurality of selection signals; and
generating a feedback signal using a local voltage level of the particular local power supply node; and
adjusting, by the voltage regulator circuit, the voltage level of the regulated power supply node using the feedback signal.

9. The method of claim 8, wherein generating the feedback signal using the voltage level of the particular local power supply node includes coupling the particular local power supply node to a feedback node through which the feedback signal propagates.

10. The method of claim 9, wherein the integrated circuit includes a plurality of power switch circuits, and wherein generating the feedback signal includes activating a particular device within a particular power switch circuit of the plurality of power switch circuits, wherein the particular device is coupled between the particular local power supply node and the feedback node.

11. The method of claim 8, further comprising:
selecting a first local power supply node for a first time period;
selecting a second local power supply node for a second time period; and
generating the feedback signal using a first voltage level of the first local power supply node during the first time period; and
generating the feedback signal using a second voltage level of the second local power supply node during the second time period.

12. The method of claim 11, wherein the first time period and the second time period are non-overlapping.

13. The method of claim 8, further comprising de-coupling a different local power supply node of the corresponding plurality of local power supply nodes from the package power supply node in response to activating a power gating mode, wherein the different local power supply node is coupled to a different circuit block of the plurality of circuit blocks.

14. The method of claim 8, wherein the plurality of circuit blocks includes at least one processor circuit.

15. An apparatus, comprising:
a substrate including a plurality of traces;
a first package coupled to the substrate, wherein the first package includes a first integrated circuit including a voltage regulator circuit configured to generate a particular voltage level on a power supply node using a feedback signal, wherein the power supply node is coupled to a particular trace of the plurality of traces; and
a second package coupled to the substrate, wherein the second package includes a second integrated circuit that includes a plurality of circuit blocks coupled to a corresponding plurality of local power supply nodes, wherein the second integrated circuit is configured to:
generate a plurality of selection signals whose respective durations are based on corresponding power consumptions of the plurality of circuit blocks;
select a particular local power supply node of the corresponding plurality of local power supply nodes using a particular one of the plurality of selection signals; and
generate the feedback signal using a voltage level of the particular local power supply node.

16. The apparatus of claim 15, wherein to generate the feedback signal using the voltage level of the particular local power supply node, the second integrated circuit is further configured to couple the particular local power supply node to a feedback trace of the plurality of traces, wherein the feedback signal propagates through the feedback trace.

17. The apparatus of claim 16, wherein the second integrated circuit includes a plurality of power switch circuits, and wherein to generate the feedback signal the second integrated circuit is further configured to activate a particular device within a particular power switch circuit of the plurality of power switch circuits, wherein the particular device is coupled between the particular local power supply node and the feedback trace.

18. The apparatus of claim 15, wherein the second integrated circuit is further configured to:

select a first local power supply node of the corresponding plurality of local power supply nodes for a first time period;

select a second local power supply node of the corresponding plurality of local power supply nodes for a second time period; and generate the feedback signal using a first voltage level of the first local power supply node during the first time period; and generate the feedback signal using a second voltage level of the second local power supply node during the second time period.

19. The apparatus of claim 15, wherein the second integrated circuit is further configured to de-couple a different local power supply node of the corresponding plurality of local power supply nodes from the particular trace in response to activating a power gating mode, wherein the different local power supply node is coupled to a different circuit block of the plurality of circuit blocks.

20. The apparatus of claim 15, wherein the second integrated circuit includes a power switch circuit coupled between the particular trace and the particular local power supply node.

* * * * *